United States Patent
Kotani

(10) Patent No.: US 6,326,253 B1
(45) Date of Patent: Dec. 4, 2001

(54) METHOD FOR FABRICATING SEMICONDUCTOR DEVICE INCLUDING MIS AND BIPOLAR TRANSISTORS

(75) Inventor: Naoki Kotani, Hyogo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/333,050

(22) Filed: Jun. 15, 1999

(30) Foreign Application Priority Data

Jul. 8, 1998 (JP) .................................................. 10-192941

(51) Int. Cl.$^7$ ................................................ H01L 21/8238
(52) U.S. Cl. .......................... 438/202; 438/204; 438/234
(58) Field of Search .................................... 438/309, 314, 438/202, 207, 234

(56) References Cited

U.S. PATENT DOCUMENTS

| | | | |
|---|---|---|---|
| 4,996,584 | * 2/1991 | Young et al. | 257/762 |
| 5,374,566 | * 12/1994 | Iranmanesh | 438/202 |
| 5,466,612 | * 11/1995 | Fuse et al. | 438/60 |
| 5,597,757 | * 1/1997 | Maeda et al. | 438/234 |
| 5,717,230 | * 2/1998 | Chua et al. | 257/209 |
| 5,970,333 | * 10/1999 | Gris et al. | 438/207 |

FOREIGN PATENT DOCUMENTS 1-216572   8/1989  (JP).

* cited by examiner

Primary Examiner—Charles Bowers
Assistant Examiner—William M. Brewster
(74) Attorney, Agent, or Firm—Eric J. Robinson; Nixon Peabody LLP

(57) ABSTRACT

After an oxide film has been completely removed from the surface of a substrate by dip etching, the substrate is inserted into a furnace at a temperature as low as about 400° C. to deposit an amorphous silicon film thereon with almost no oxide film existing therebetween. The amorphous silicon film is then patterned into a base electrode and a dopant contained in the base electrode is diffused into the substrate through annealing to form an extrinsic base diffused layer. Thereafter, an intrinsic base diffused layer is formed by ion implantation and an emitter diffused layer is formed by diffusing a dopant from an emitter electrode. Since an oxide film existing between the base electrode and the substrate can be thinner, excessive expansion of the extrinsic base diffused layer due to the diffusion of the dopant can be suppressed. As a result, a semiconductor device, including a bipolar transistor operating at a higher frequency with an increased emitter-base breakdown voltage and improved radio frequency characteristics, can be formed.

6 Claims, 16 Drawing Sheets

METHOD FOR FABRICATING SEMICONDUCTOR DEVICE INCLUDING MIS AND BIPOLAR TRANSISTORS

BACKGROUND OF THE INVENTION

The present invention relates to a method for fabricating a semiconductor device serving as a Bipolar/CMOS device (abbreviated as "Bi-CMOS device"), in which a bipolar transistor operating at a radio frequency and an MOS transistor are both integrated on a single substrate.

Examples of transistors currently used most commonly include a bipolar transistor, which is made up of emitter, base and collector, and an MOS transistor, which is made up of gate electrode, gate oxide film and source/drain layers. The bipolar transistor is particularly suitably used as an analog devise by taking advantage of its linear amplifying capability. On the other hand, the MOS transistor has a simpler construction, and is particularly suitably implementable as a logical element. In recent years, bipolar transistors are more and more often adapted to operate at a radio frequency. Accordingly, the implementation of bipolar transistors operative at an even higher frequency is awaited. As for MOS transistors, downsizing of these devices is in high demand to further increase the number of MOS transistor devices integrated on a single chip.

In addition, miniaturization of a semiconductor device, including both a bipolar transistor operating at a radio frequency and an MOS transistor, is also required these days. To cut down the size of such a semiconductor device, a single-chip implementation, or forming both of these types of devices on a single substrate, is an effective measure to be taken. Thus, a so-called "Bi-CMOS device", which integrates bipolar and MOS transistors on a common substrate, was suggested.

Hereinafter, an exemplary structure of a conventional Bi-CMOS device will be described with reference to accompanying drawings. FIG. 16 is a cross-sectional view illustrating a structure of a conventional Bi-CMOS device.

As shown in FIG. 16, the conventional Bi-CMOS device includes a bipolar-transistor-forming region Rbp and an MOS-transistor-forming region Rmos, which consists of PMOSFET-and NMOSFET-forming regions Rpmos and Rnmos, within a silicon substrate 101 and an epitaxial layer 107 formed thereon. In this specification, the substrate 101 and the epitaxial layer 107 will sometimes be collectively referred to as a "sustrate".

N-type buried layers 181 and 182 are formed to be electrically isolated from each other under the bipolar-transistor-forming region Rbp and under the PMOSFET-forming region Rpmos of the MOS-transistor-forming region Rmos, respectively.

On the surface of the substrate, field oxide films 111b, 111d and 111e and cap oxide films 119a and 119b are formed by an ordinary LOCOS process. Under each of these cap oxide films 119a and 119b, buried polysilicon layer 118 (which has been formed by filling a trench with polysilicon), trench sidewall oxide film 116 and channel stopper layer 117 are provided.

The bipolar transistor includes: collector diffused layer 140; extrinsic base diffused layer 141a; intrinsic base diffused layer 141b; emitter diffused layer 142; base electrode 143; emitter electrode 145; and collector electrode 146. The collector diffused layer 140 is formed by epitaxy on the n-type buried layer 181. The extrinsic and intrinsic base diffused layers 141a and 141b are formed on the collector diffused layer 140. The emitter diffused layer 142 is located on the intrinsic base diffused layer 141b. And the base, emitter and collector electrodes 143, 145 and 146 are in contact with the extrinsic base diffused layer 141a, emitter diffused layer 142 and collector wall 121, respectively. The bipolar transistor further includes: TEOS film 144 on the base electrode 143; silicon dioxide film 147 formed on the sides of the base electrode 143 by oxidizing polysilicon; and silicon nitride film 148 and polysilicon sidewall 149 interposed between the base and emitter electrodes 143 and 145.

The PMOSFET includes: p$^+$-type source/drain layers 151; p$^-$-type source/drain (LDD) layers 152; gate oxide film 131 gate electrode 156; and polysilicon sidewall 160. The NMOSFET includes: n$^+$-type source/drain layers 153 ; n$^-$-type source/drain (LDD) layers 154; gate oxide film 131 gate electrode 158; and polysilicon sidewall 160.

In the PMOSFET-forming region Rpmos, PMOSFET threshold control layer 123, punchthrough stopper layer 124, channel stopper layer 125 covering an area from a region just under the cap oxide film 119b to a region just under the field oxide film 111d, and n-well layer 126 are formed.

In the NMOSFET-forming region Rnmos, NMOSFET threshold control layer 128, channel stopper layer 129 covering an area from a region just under the field oxide film 111d to a region just under the field oxide film 111e, and p-well layer 130 are formed.

In the conventional fabricating process of this Bi-CMOS device, the base electrode 143 is formed to make electrical contact with the extrinsic base region 141a in the bipolar transistor by depositing and patterning a polysilicon film with a thin oxide film left in the interface between the base electrode 143 and the substrate. The polysilicon film is deposited posited on the oxide film, because the existence of the oxide film can prevent the polysilicon film from growing abnormally (or an excessive epitaxial growth thereof), which is observed with a polysilicon film growing on a single crystal silicon layer, for example. Also, in the conventional process, the base electrode 143 of the bipolar transistor and the respective gate electrodes 156 and 158 of the p- and n-channel MOS transistors are all formed out of this polysilicon film. And the residual interfacial oxide film is broken down by annealing at an elevated temperature, thereby reducing the contact resistance between the base electrode and the extrinsic base diffused layer.

However, according to the conventional method for fabricating a Bi-CMOS device, an oxide remains here and there in the interface between the base electrode and the extrinsic base diffused layer, and the contact resistance adversely increases at those sites. Nevertheless, if the thickness of the oxide film is reduced to suppress the increase in contact resistance, then the abnormal growth of the polysilicon film cannot be restricted sufficiently. In addition, since the high-temperature annealing promotes the diffusion of the extrinsic base diffused layer, the base-collector capacitance cannot be reduced sufficiently. In particular, to make a semiconductor device operative at an even higher frequency, the parasitic capacitance thereof should be reduced. If the area of an active region is decreased to reduce the parasitic capacitance, however, the extrinsic base diffused layer might possibly contact the emitter diffused layer.

Also, it was recently found that if the thickness of the oxide film is reduced, then the grain size of crystals is very likely to increase excessively due to the epitaxial growth happening in the interface between the epitaxial layer and the polysilicon film deposited thereon. Accordingly, the resulting performance of the bipolar transistor is much more likely to be inconstant.

FIG. 14(a) is a graph illustrating respective dependence of maximum current gain cutoff frequency $fT_{max}$ and emitter-base breakdown voltage $BV_{EBO}$ on the diffusion length L of the extrinsic base diffused layer, which is defined as illustrated in FIG. 14(b). The data shown in FIG. 14(a) was obtained on a bipolar transistor shown in FIG. 14(b), where a lateral distance from an end face of the base electrode at a lower edge of the sidewall to the surface of the sidewall was about 0.19 $\mu$m. On and after the diffusion length L of the extrinsic base diffused layer as measured from the end face of the base electrode exceeds 0.19 $\mu$m, the extrinsic base diffused layer contacts the emitter diffused layer. Accordingly, as shown in FIG. 14(a), the emitter-base breakdown voltage $BV_{EBO}$ decreases and the parasitic capacitance increases in such a case. In addition, since the effective base width increases when the extrinsic base layer reaches a region just under the emitter layer, the maximum current gain cutoff frequency $fT_{max}$ also decreases.

FIG. 15 is a chart illustrating variations in emitter-base breakdown voltage $BV_{EBO}$ and sheet resistance of the extrinsic base diffused layer among several production lots. As shown in FIG. 15, due to a variation among the production lots, the emitter-base breakdown voltage $BV_{EBO}$ or sheet resistance of the extrinsic base diffused layer is sometimes out of its specific target range. The polysilicon sidewall is originally intended to ensure isolation between the extrinsic base diffused layer and the emitter diffused layer. It was found, however, that the sidewall could not always play the expected role depending on the variation in processing conditions. It seems that this was probably because the diffusion length L of the extrinsic base diffused layer had exceeded 0.19 $\mu$m as measured from the end face of the base electrode as shown in FIG. 14(a).

SUMMARY OF THE INVENTION

A primary object of the present invention is providing a method for fabricating a semiconductor device including a bipolar transistor, which can advantageously operate at a higher frequency and includes a base electrode with a reduced resistance showing a smaller variation.

Another object of the present invention is providing a method for fabricating a semiconductor device including a bipolar transistor, which exhibits emitter-base breakdown voltage and radio frequency characteristics good enough to operate at a higher frequency.

A method for fabricating a semiconductor device according to the present invention is a method for fabricating a bipolar transistor including: an emitter diffused layer of a first conductivity type; a base diffused layer of a second conductivity type; and a collector diffused layer of the first conductivity type. The method includes the steps of: a) providing an isolating region on a semiconductor substrate to divide a region of the semiconductor substrate, where the bipolar transistor is to be formed, into an active region and a collector-forming region; b) removing an oxide film from the surfaces of the collector-forming region and active region; c) forming an amorphous semiconductor film, containing a dopant of the second conductivity type, over the semiconductor substrate after the step b) has been performed; d) forming an upper insulating film over the entire surface of the semiconductor film; e) patterning the upper insulating film and the semiconductor film to form a base electrode over the active region, the base electrode having an opening for emitter electrode; f) diffusing the dopant of the second conductivity type, contained in the base electrode, into the semiconductor substrate through annealing, thereby forming an extrinsic base diffused layer; g) implanting dopant ions of the second conductivity type through the opening for emitter electrode into the semiconductor substrate using the base electrode as a mask, thereby forming an intrinsic base diffused layer linked to the extrinsic base diffused layer; h) forming the emitter diffused layer by introducing a dopant of the first conductivity type into a region of the semiconductor substrate, which is located over the intrinsic base diffused layer, and forming an emitter electrode within the opening for emitter electrode so as to contact the emitter diffused layer; and i) forming the collector diffused layer, containing the dopant of the second conductivity type, and a collector electrode, contacting the collector diffused layer, in the collector-forming region.

In this method, after the oxide film has been removed in the step b), the semiconductor film is formed in the step c). Accordingly, almost no oxide film exists between the semiconductor film and the semiconductor substrate. Also, even if no oxide film exists on the semiconductor substrate, the amorphous semiconductor film hardly grows abnormally unlike a polycrystalline semiconductor film. Thus, a semiconductor device exhibiting excellent radio frequency characteristics can be formed without deteriorating the characteristics because of the abnormal growth of the semiconductor film.

In addition, unlike the conventional process using the annealing step f) for breaking down the oxide film, there is no need to conduct annealing for the purpose of breaking down the oxide film. Thus, in the step f), the dopant, which is contained in the base electrode, can be diffused within a desired range in the semiconductor substrate. That is to say, unlike the conventional process, the base diffused layer formed in this way does not come into contact with the emitter layer to be formed later even if processing conditions have varied.

In one embodiment of the present invention, the step b) may be performed such that the oxide film is completely removed by dip etching after the semiconductor substrate has been boiled within a mixed water of hydrogen peroxide and ammonium.

In such an embodiment, the oxide film can be removed easily and with a lot more certainty.

In another embodiment of the present invention, the semiconductor substrate may be inserted into a furnace at 400° C. or less, and the semiconductor film may be grown at a temperature between 500° C. and 550° C. in the step c).

In such an embodiment, it is possible to prevent an oxide film from being re-grown on the semiconductor substrate.

In still another embodiment, the step f) may be performed at a temperature of 900° C. or less.

In such an embodiment, the diffusion range of the extrinsic base diffused layer can be restricted, and it is possible to prevent the deterioration in radio frequency characteristics and the decrease in emitter-base breakdown voltage.

In still another embodiment, the region where the bipolar transistor is to be formed may be isolated in the step a) from a region where an MIS transistor is to be formed via the isolating film. And in the step e), the semiconductor film may be patterned to form a gate electrode on the region where the MIS transistor is to be formed.

In this way, a semiconductor device can be formed to include both a bipolar transistor and an MIS transistor.

In still another embodiment, the method may further include the step of forming a sidewall on a side of the base electrode between the steps g) and h). In the step h), after the emitter electrode, containing the dopant of the first conductivity type, has been formed within a region surrounded by the sidewall, the dopant of the first conductivity type contained in the emitter electrode may be diffused by annealing toward the region over the intrinsic base diffused layer to form the emitter diffused layer.

In such an embodiment, the emitter diffused layer and the extrinsic base diffused layer can be isolated from each other with more certainty. As a result, a semiconductor device can be formed to exhibit excellent radio frequency characteristics and a high emitter-base breakdown voltage.

DESCRIPTION OF THE PREFERRED EMBODIMENTS

Hereinafter, an exemplary embodiment of the method for fabricating a semiconductor device according to the present invention will be described with reference to the accompanying drawings.

FIGS. 1 through 11 are cross-sectional views illustrating respective process steps for fabricating a semiconductor device according to an embodiment of the present invention.

Figure 1:
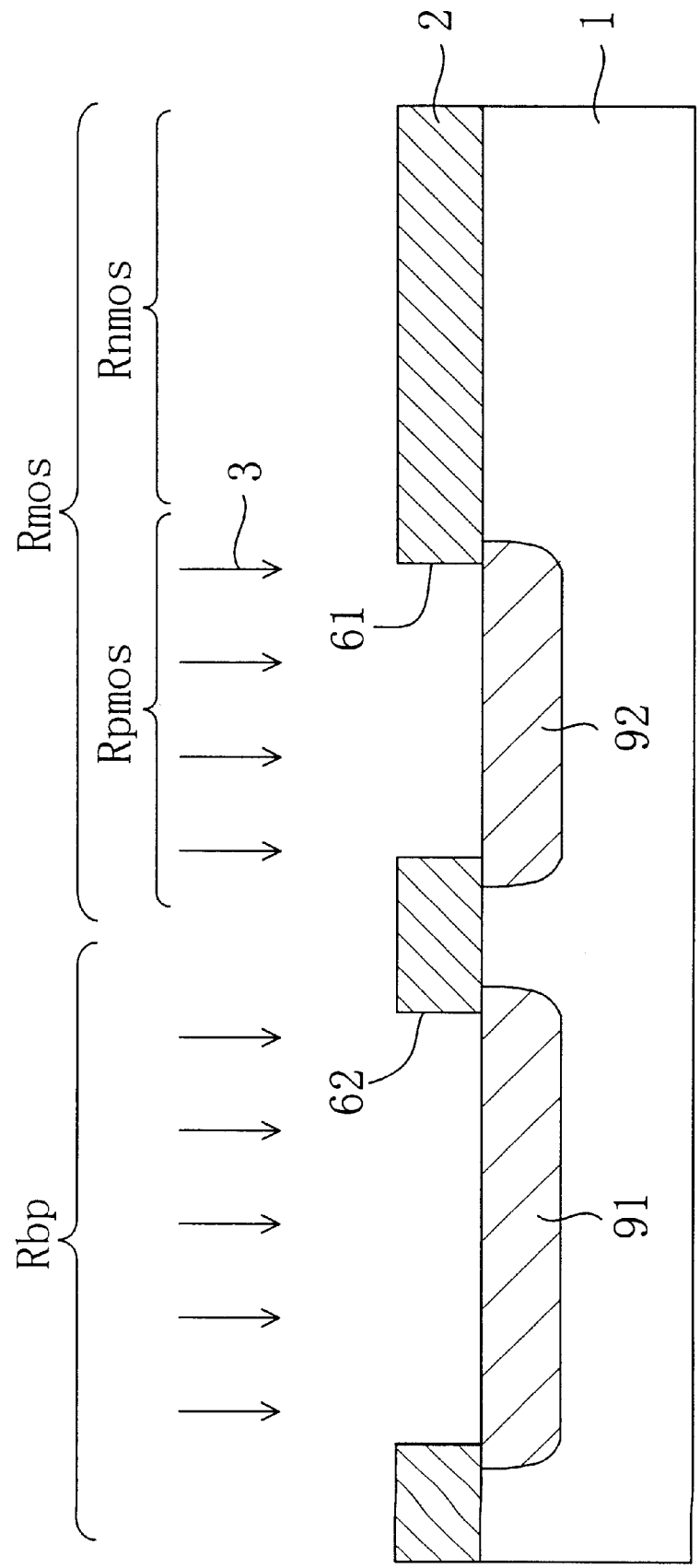
FIG. 1 is a cross-sectional view illustrating the process step of forming deep-level implanted layers according to a method for fabricating a semiconductor device in an exemplary embodiment of the present invention.

First, in the process step shown in FIG. 1, the principal surface of a p-type silicon substrate 1 is oxidized to form a silicon dioxide film thereon. A photoresist film (not shown) is defined on the silicon dioxide film by lithography, and the silicon dioxide film is etched and selectively removed using the resist film as a mask. In this manner, a mask oxide film 2 is formed to have openings 61 and 62 in an MOS-transistor-forming region Rmos and a bipolar-transistor-forming region Rbp, respectively.

Next, arsenic ions 3 are implanted at a dose of $1.5 \times 10^{15}$ ions/cm$^2$ into the p-type silicon substrate 1 from above the principal surface thereof with an accelerating voltage of 30 keV applied, for example, and the mask oxide film 2 used as a mask, thereby forming deep-level implanted layers 91 and 92 in the bipolar- and MOS-transistor-forming regions Rbp and Rmos, respectively.

Thereafter, the arsenic atoms, implanted in the deep-level implanted layers 91 and 92, are diffused by annealing, the surface of the substrate 1 is oxidized to form a level difference for patterning, and then the mask oxide film 2 is removed entirely.

Subsequently, in the process step shown in FIG. 2, an n-type epitaxial layer 7 is grown over the entire principal surface of the p-type silicon substrate 1. In this process step, part of the arsenic atoms in the deep-level implanted layers 91 and 92, which are formed along the principal surface of the p-type silicon substrate 1 (see FIG. 1), diffuse into the epitaxial layer 7. As a result, very deep and wide n-type buried layers 81 and 82 are formed. It should be noted, however, that the epitaxy should be performed under such conditions that the n-type buried layer 81 in the bipolar-transistor-forming region Rbp does not come into contact with the n-type buried layer 82 in the MOS-transistor-forming region Rmos. Consequently, the n-type buried layer 81 is formed over a wide range covering the entire bipolar-transistor-forming region Rbp, while the n-type buried layer 82 is formed only in the PMOSFET-forming region Rpmos within the MOS-transistor-forming region Rmos. A collector diffused layer 40, into which arsenic atoms have diffused at a low concentration, is formed over the n-type buried layer 81 within the bipolar-transistor-forming region Rbp.

Next, a passivation film 9 of silicon dioxide and a first silicon nitride film 10 are formed in this order on the epitaxial layer 7. Then, field oxide films 11a, 11b, 11c, 11d and 11e are formed by an ordinary LOCOS process at respective predetermined isolating regions. In this case, the field oxide film 11a is formed over one end of the n-type buried layer 81 and an outer region thereof within the bipolar-transistor-forming region Rbp. The field oxide film 11b is formed over around the center of the n-type buried layer 81. The field oxide film 11c is formed over the other end of the n-type buried layer 81 and an outer region thereof. The field oxide film lid is formed above an end of the n-type buried layer 82 closer to the center of the MOS-transistor-forming region Rmos. And the field oxide film 11e is formed over a boundary between the MOS-transistor-forming region Rmos and an outer region thereof.

Figure 3:
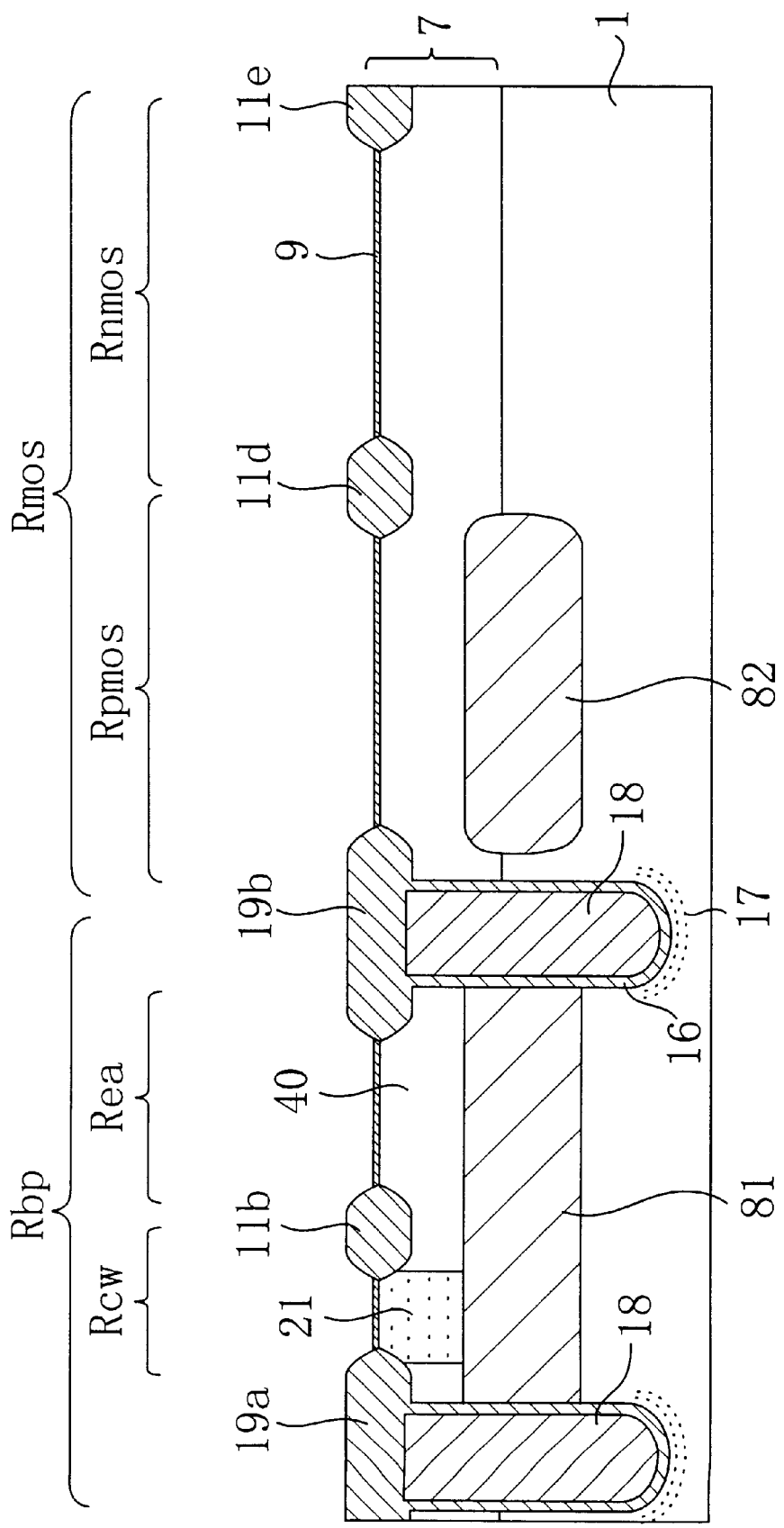
FIG. 3 is a cross-sectional view illustrating the process step of forming a collector wall according to the exemplary method of the present invention.

Thereafter, in the process step shown in FIG. 3, trenches are formed through the field oxide films 11a and 11c and within the silicon substrate 1. A channel stopper layer 17 is formed under each trench by implanting boron ions at a dose of $1.0 \times 10^{12}$ ions/cm$^2$ with an accelerating voltage of 30 keV applied, for example. A sidewall oxide film 16 and a buried polysilicon layer 18 are formed within each trench. And cap oxide films 19a and 19b are formed over the buried polysilicon layers 18 to be integrated with the field oxide films 11a and 11c, respectively.

Furthermore, a photoresist film (not shown) with an opening over a collector wall region Rcw is defined by lithography to cover an active region Rea within the bipolar-transistor-forming region Rbp. Using this resist film as a mask, phosphorus ions are implanted into the substrate at a dose of $3.0 \times 10^{15}$ ions/cm$^2$ with an accelerating voltage of 60 keV applied, for example, thereby forming a collector wall 21.

Figure 2:
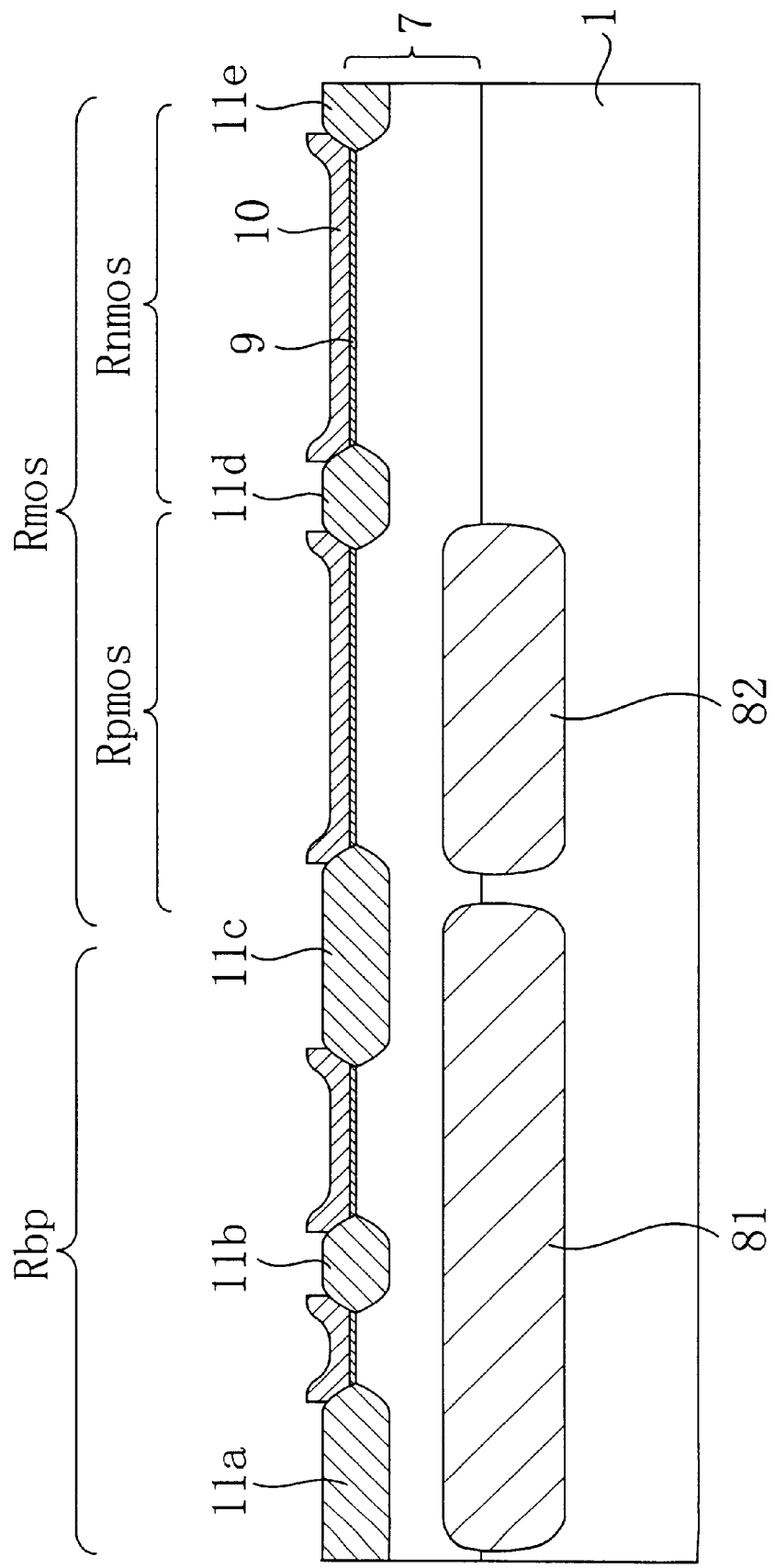
FIG. 2 is a cross-sectional view illustrating the process step of forming field oxide films according to the exemplary method of the present invention.

Since the trench isolation structure has been formed by performing the series of process steps shown in FIGS. 1 through 3, the junction capacitance between the collector and the substrate decreases in the bipolar-transistor-forming region Rbp. Accordingly, the bipolar transistor can operate at a higher frequency. Also, since the width of each field oxide film 11 may be shorter than that of the pn junction isolation region, the interconnection capacitance decreases and the bipolar transistor can operate at an even higher frequency.

Figure 4:
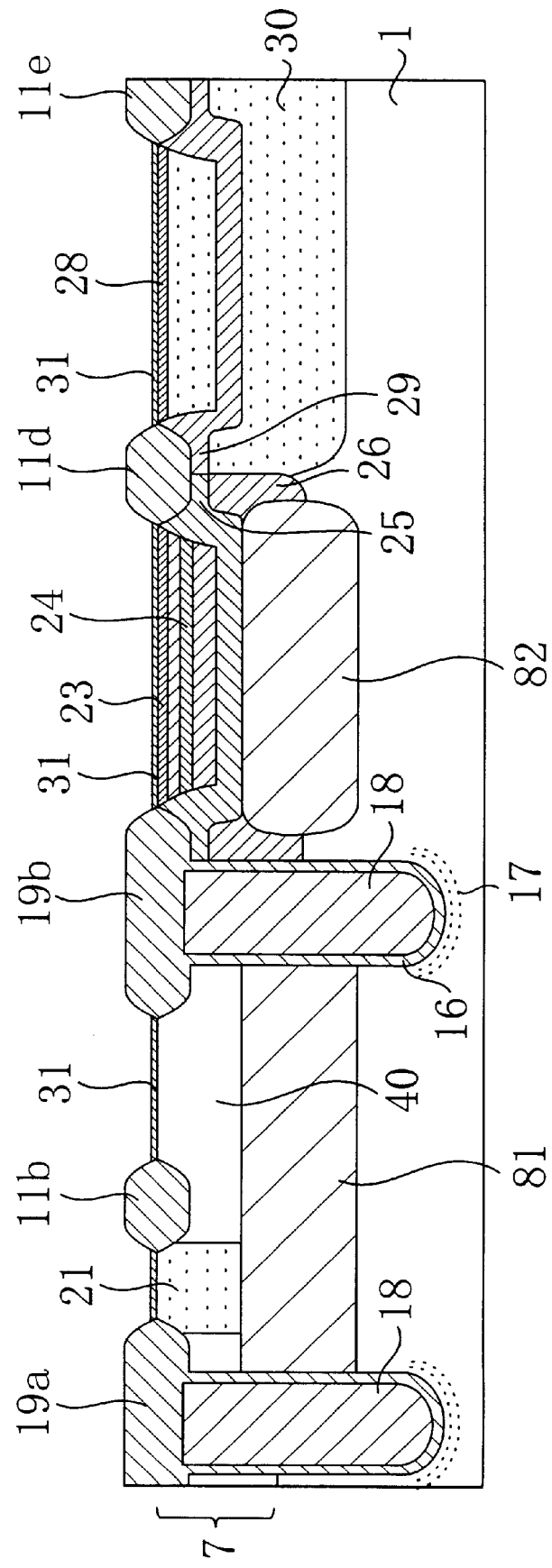
FIG. 4 is a cross-sectional view illustrating the process step of forming respective diffused layers in an MOS-transistor-forming region according to the exemplary method of the present invention.

Next, in the process step shown in FIG. 4, a photoresist film (not shown) with an opening over the PMOSFET-forming region Rpmos of the MOS-transistor-forming region Rmos is defined by lithography. Using this resist film as a mask, boron ions are implanted into the substrate at a dose of $6.3 \times 10^{12}$ ions/cm$^2$ with an accelerating voltage of 15 keV applied, for example, thereby forming a PMOSFET threshold control layer 23. Then, using the same resist film as a mask, phosphorus ions are continuously implanted by a high-energy ion implantation technique into the substrate at a dose of $6.6 \times 10^{12}$ ions/cm$^2$ with an accelerating voltage of 160 keV applied, for example, thereby forming a punch-through stopper layer 24 below the threshold control layer 23. Thereafter, using the same resist film as a mask, phosphorus ions are further implanted into the substrate at a dose of $7.0 \times 10^{12}$ ions/cm$^2$ with an accelerating voltage of 350 keV applied, for example, thereby forming a channel stopper layer 25 in respective regions just under the cap oxide film 19b and the field oxide film lid. Then, using the same resist film as a mask, phosphorus ions are further implanted into the substrate at a dose of $1.0 \times 10^{13}$ ions/cm$^2$ with an accelerating voltage of 700 keV applied, for example, thereby forming an n-well layer 26 over a wide area ranging from the region just under the threshold control layer 23 to a region below the channel stopper layer 24.

Then, a photoresist film (not shown) with an opening over the NMOSFET-forming region Rnmos of the MOS-transistor-forming region Rmos is defined by lithography. Using this resist film as a mask, phosphorus ions are implanted into the substrate at a dose of $4.6 \times 10^{12}$ ions/cm$^2$ with an accelerating voltage of 30 keV applied, for example, thereby forming an NMOSFET threshold control layer 28. Then, using the same resist film as a mask, boron ions are implanted by a high-energy ion implantation technique into the substrate at a dose of $7.0 \times 10^{12}$ ions/cm$^2$ with an accelerating voltage of 180 keV applied, for example, thereby forming a channel stopper layer 29 covering respective regions just under the field oxide films 11d and 11e. Then, using the same resist film as a mask, boron ions are further implanted into the substrate at a dose of $4.4 \times 10^{12}$ ions/cm$^2$ with an accelerating voltage of 400 keV applied, for example, thereby forming a p-well layer 30 over a wide area ranging from the region just under the threshold control layer 28 to a region below the channel stopper layer 29.

Subsequently, the passivation film 9 is entirely removed by wet etching, and a gate oxide film 31 is grown to be 11.7 nm thick by thermal oxidation. It is noted that the oxide film 31 may be replaced with an oxynitride film, for example.

Figure 5:
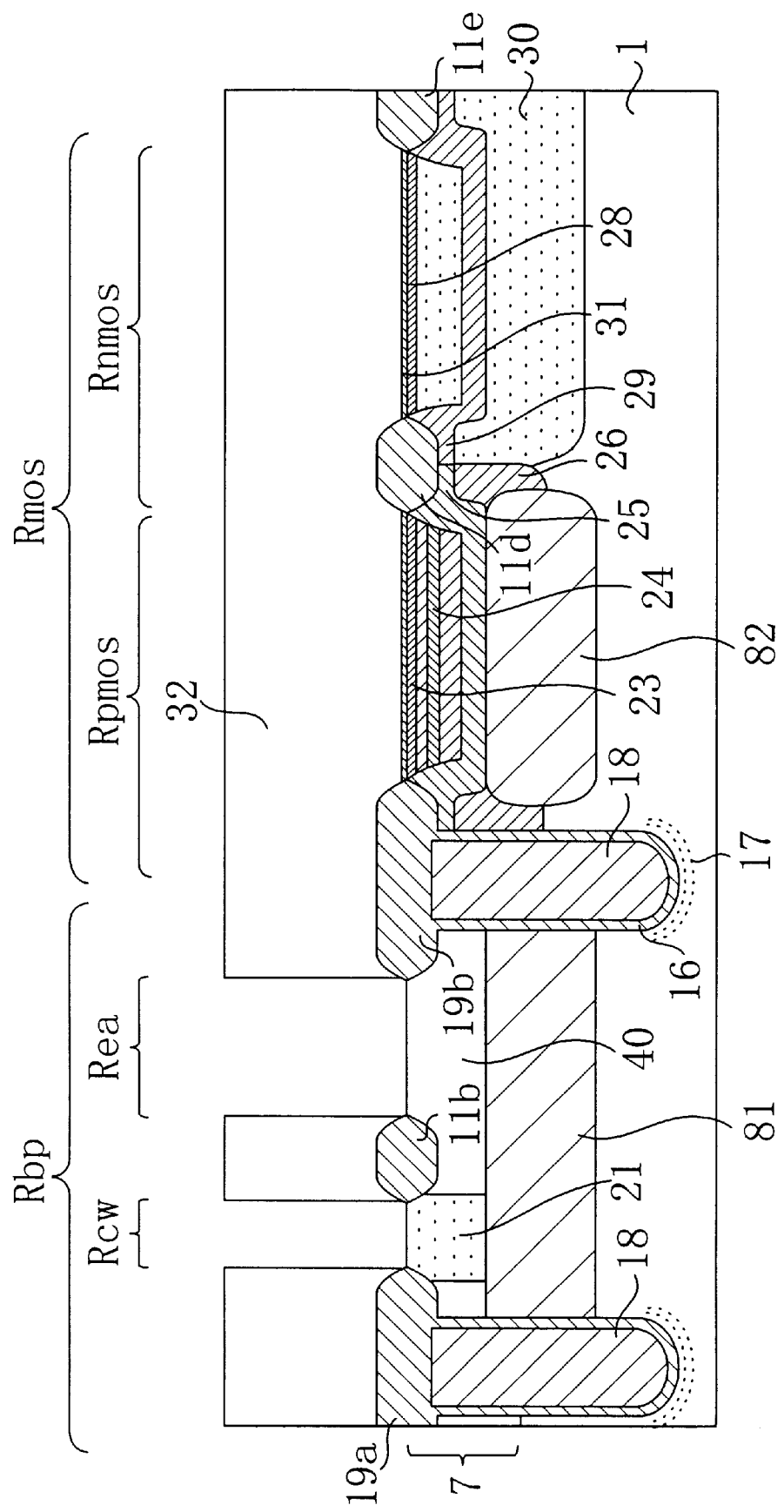
FIG. 5 is a cross-sectional view illustrating the process step of removing a chemical oxide film from collector wall and active regions according to the exemplary method of the present invention.

Next, in the process step shown in FIG. 5, a photoresist film 32 is defined by lithography to have respective openings over the collector wall region Rcw and the active region Rea of the bipolar-transistor-forming region Rbp. Then, only the portions of the gate oxide film 32, which are located within the openings of the photoresist film 32, are removed by wet etching. Before the substrate is inserted into a furnace, the substrate is cleaned with an aqueous solution of sulfuric acid and hydrogen peroxide, and boiled within a mixed water of hydrogen peroxide and ammonium. And the substrate is subjected to dip etching, thereby totally removing a chemical oxide film on the substrate. Thereafter, the photoresist film 32 is removed.

Figure 6:
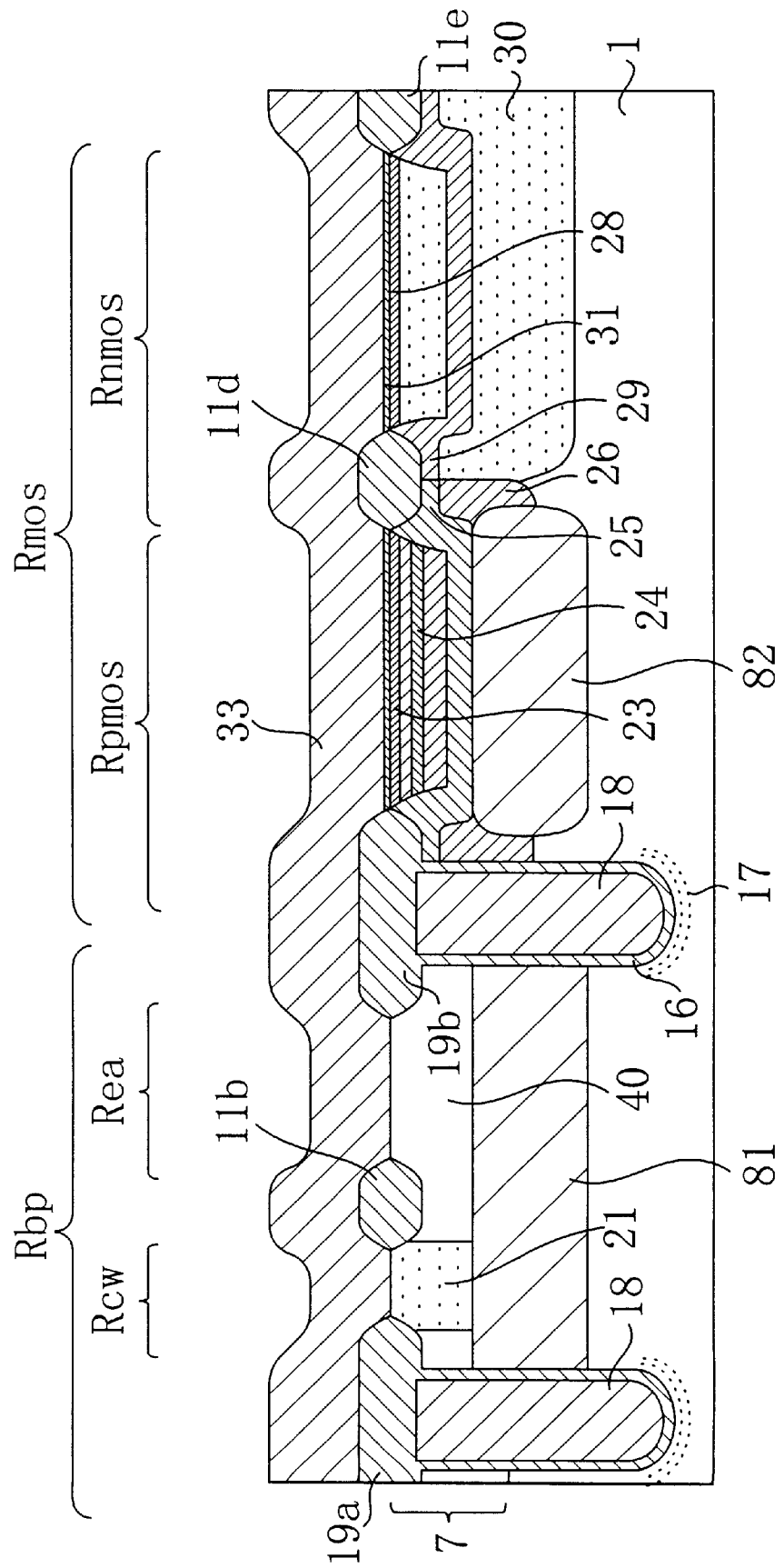
FIG. 6 is a cross-sectional view illustrating the process step of depositing an amorphous silicon film over a substrate according to the exemplary method of the present invention.

Subsequently, in the process step shown in FIG. 6, the semiconductor substrate (in the shape of wafer) is inserted into the furnace at a temperature of 400° C., for example. Then, a silicon film 33, from which the base and gate electrodes will be formed, is grown on the substrate at 530° C., for example. In this case, the silicon film 33 is amorphous, not polysilicon as in the conventional fabrication process.

Figure 7:
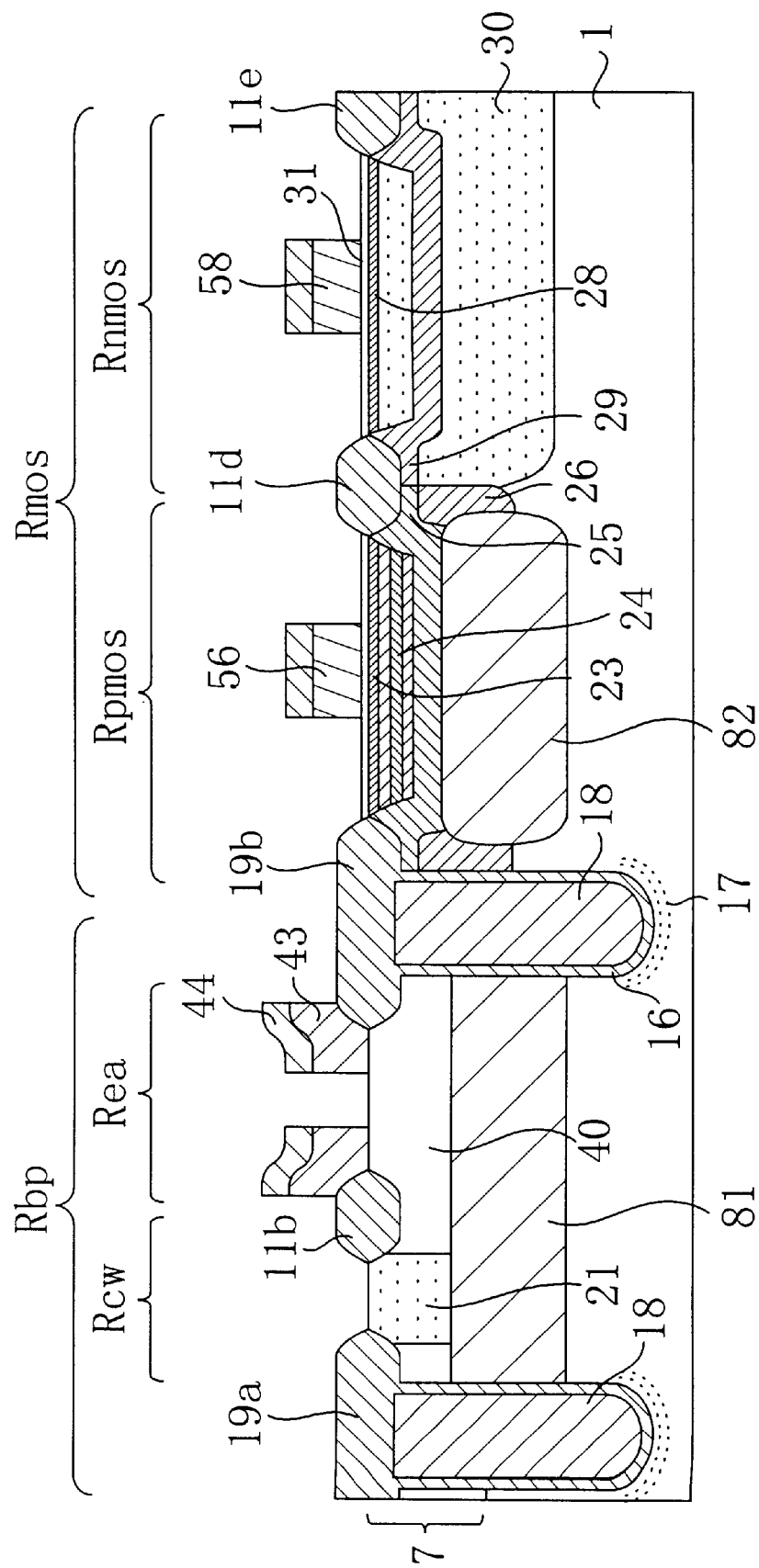
FIG. 7 is a cross-sectional view illustrating the process step of forming base and gate electrodes by patterning the silicon film and a TEOS film according to the exemplary method of the present invention.

Next, in the process step shown in FIG. 7, a photoresist film (not shown) with an opening over the bipolar-transistor-forming region Rbp is defined on the silicon film 33 by lithography. Then, boron ions are implanted into a region of the silicon film 33 within the opening of the resist film at a dose of $7.0 \times 10^{15}$ ions/cm$^2$ with an accelerating voltage of 30 keV applied, for example. After the ions have been implanted, the resist film is removed. Next, an oxide film mask (not shown) with an opening over the MOS-transistor-forming region Rmos is defined on the silicon film 33 by lithography and wet etching. Then, phosphorus ions are implanted into a region of the silicon film 33 within the opening of the oxide film mask at a dose of $1.2 \times 10^{16}$ ions/cm$^2$ with an accelerating voltage of 30 keV applied, for example. After the ions have been implanted, the oxide film mask is removed by wet etching.

Thereafter, a TEOS film 44 is grown over the entire surface of the silicon film 33. And the TEOS film 44 and the silicon film 33 are patterned by lithography and dry etching, thereby forming the base electrode 43 for the bipolar transistor and the gate electrodes 56 and 58 for the MOS transistors at the same time.

Figure 8:
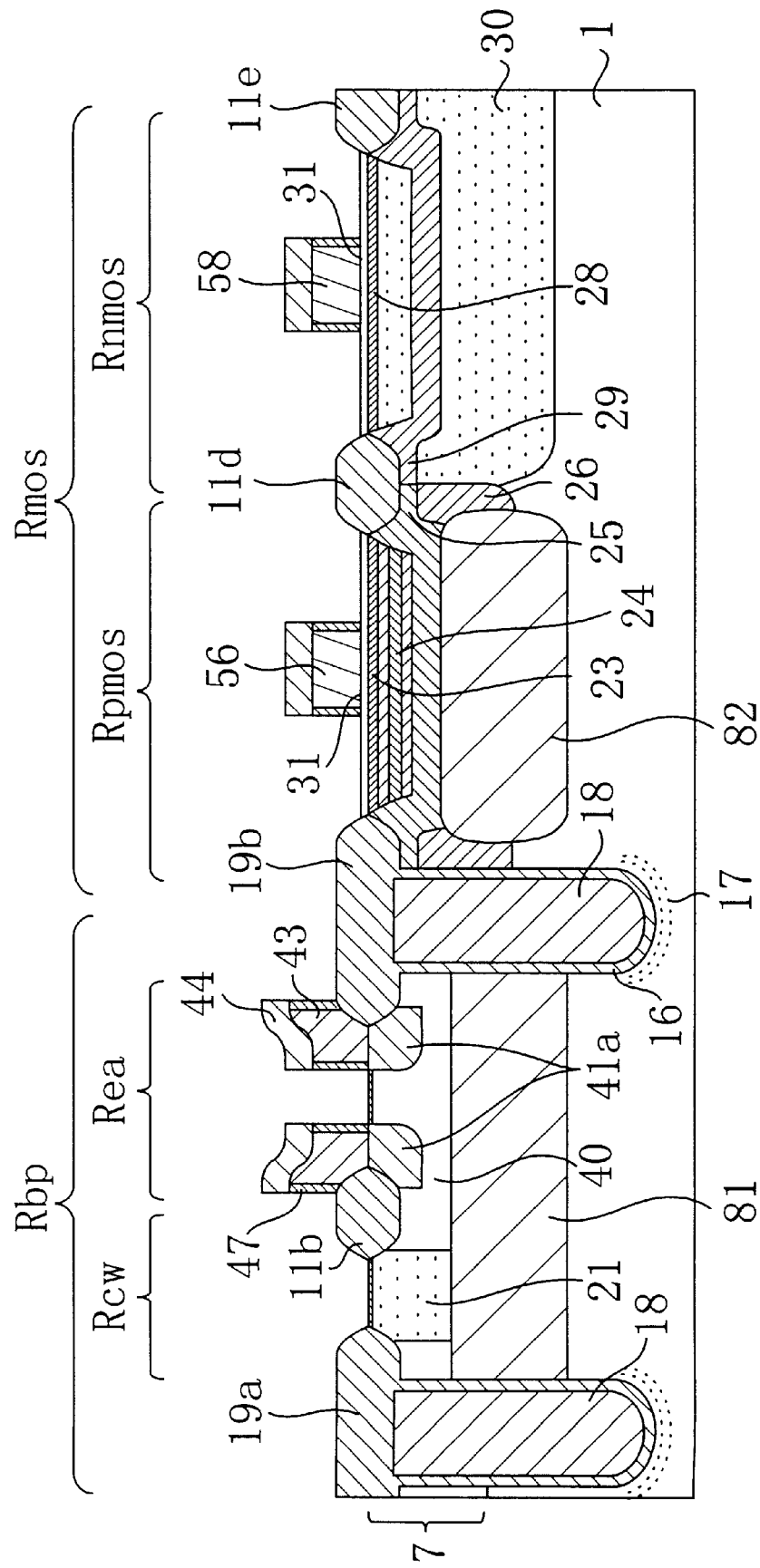
FIG. 8 is a cross-sectional view illustrating the process step of forming a silicon dioxide film on the side faces of respective electrodes and then an extrinsic base diffused layer back to back according to the exemplary method of the present invention.

Next, in the process step shown in FIG. 8, the entire surface of the substrate is oxidized at 900° C., for example, thereby forming a silicon dioxide film 47 on the respective side faces of the base electrode 43 and gate electrodes 56 and 58. Then, the substrate is continuously annealed at 900° C. for 15 minutes, for example, thereby diffusing boron atoms from the base electrode 43 (or the silicon film) of the bipolar transistor into the collector diffused layer 40 to form an extrinsic base diffused layer 41a. At the same time, the dopants within the respective gate electrodes 56 and 58 of the p- and n-channel MOS transistors are also activated. As a result of this annealing, the silicon film 33, which has been deposited in the amorphous state, is crystallized.

Figure 9:
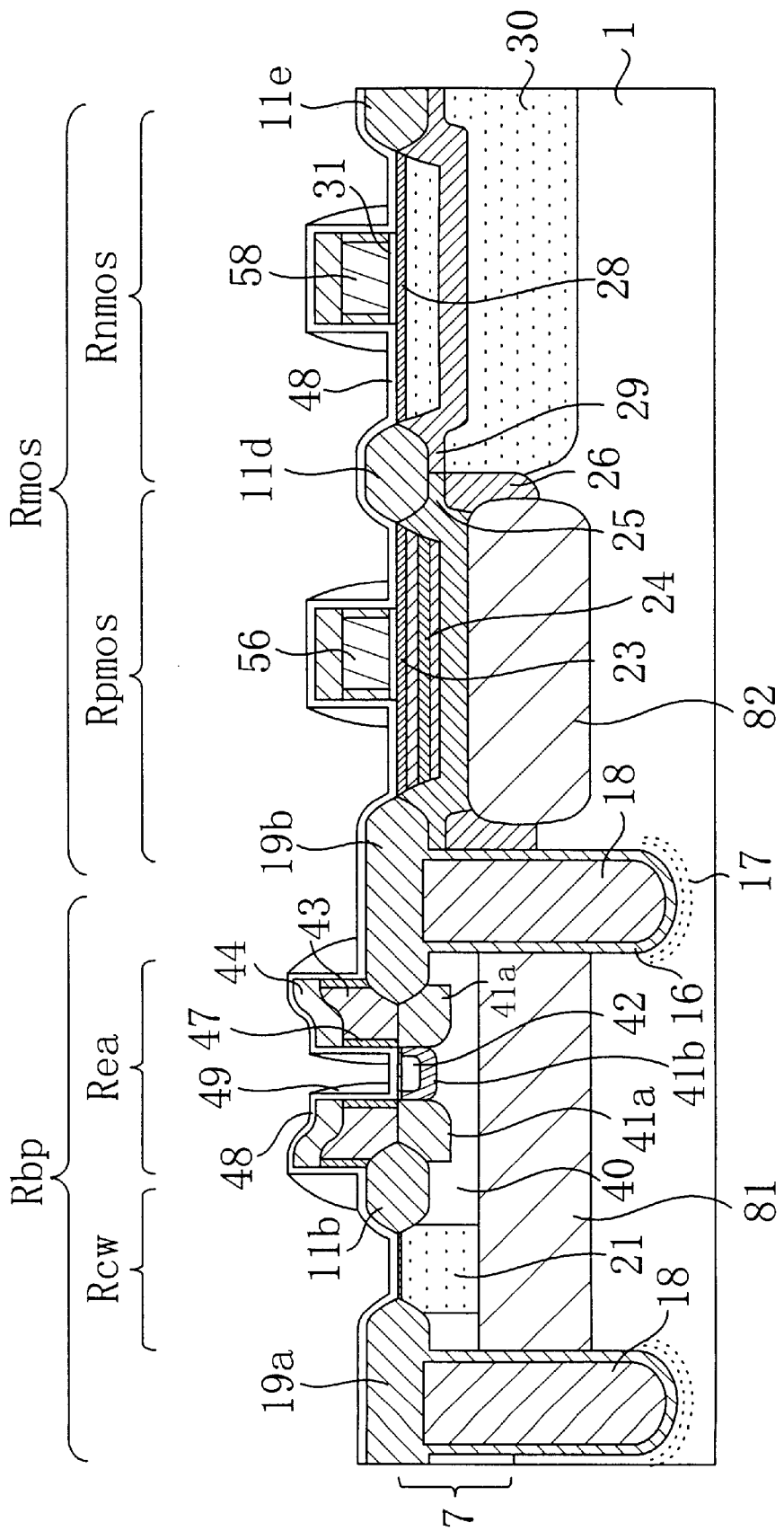
FIG. 9 is a cross-sectional view illustrating the process step of forming an intrinsic base diffused layer and then polysilicon sidewalls according to the exemplary method of the present invention.

Subsequently, in the process step shown in FIG. 9, boron ions are implanted only into the active region Rea for the bipolar transistor at a dose of $1.5 \times 10^{13}$ ions/cm$^2$ with an accelerating voltage of 10 keV applied, for example. As a result, an intrinsic base diffused layer 41b is formed to be interposed between the extrinsic base diffused layer 41a on right and left sides. Next, a second silicon nitride film 48 and a polysilicon film are continuously grown in this order over the entire surface of the substrate. Then, the polysilicon film and the second silicon nitride film 48 are etched back by dry etching, thereby forming polysilicon sidewalls 49 on the respective side faces of the base electrode 43 and the gate electrodes 56 and 58.

Figure 10:
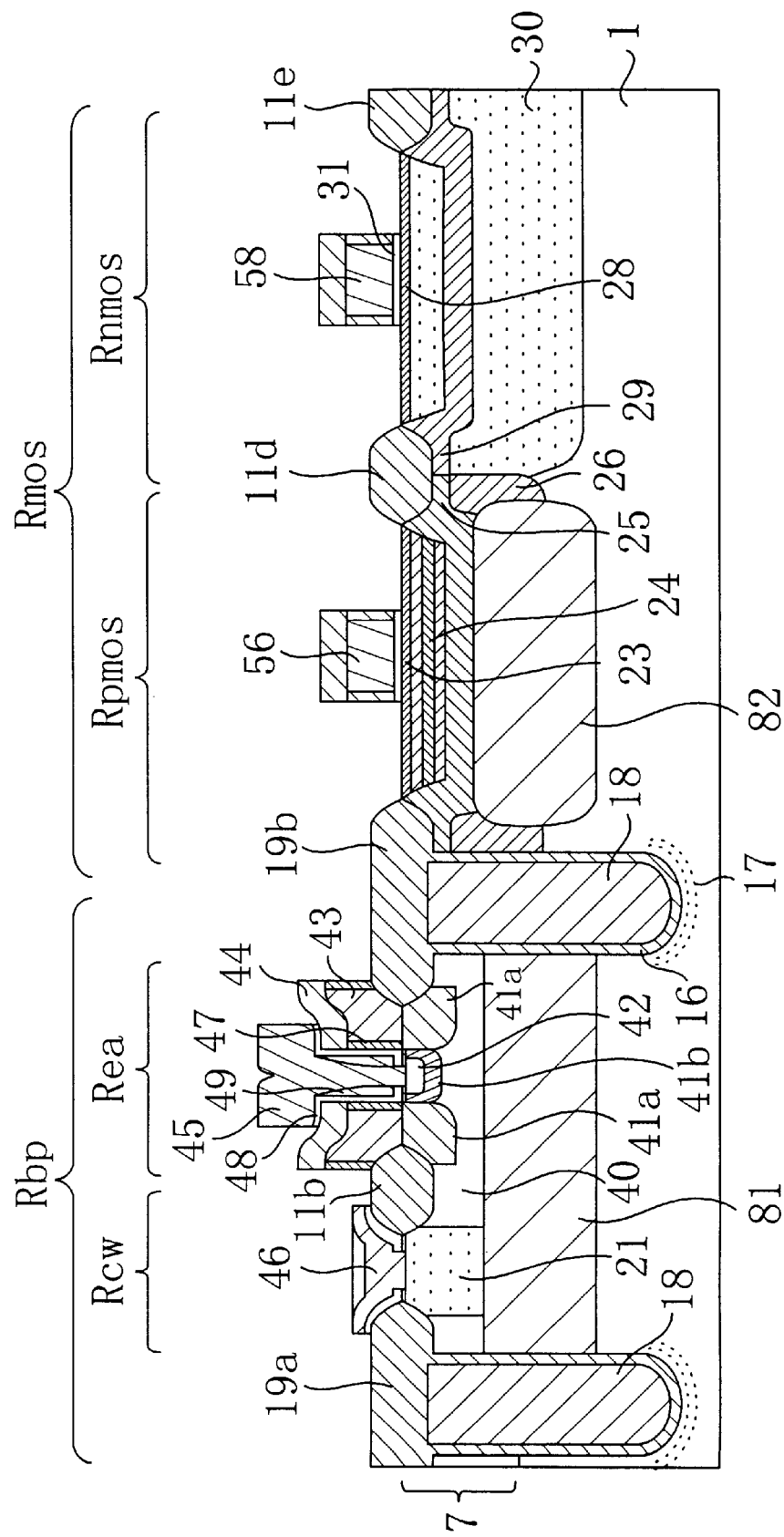
FIG. 10 is a cross-sectional view illustrating the process step of forming an emitter electrode and then an emitter diffused layer according to the exemplary method of the present invention.

Then, in the process step shown in FIG. 10, openings are formed by dry and wet etching processes in respective parts of the second silicon nitride film 48 over the active region Rea and the collector wall region Rcw. Thereafter, a polysilicon film, from which emitter and collector electrodes 45 and 46 will be formed, is grown over the substrate, and implanted with arsenic ions at a dose of $8.0 \times 10^{15}$ ions/cm$^2$ with an accelerating voltage of 40 keV applied, for example. Then, the polysilicon film is patterned by lithography and dry etching into the emitter and collector electrodes 45 and 46. Thereafter, the polysilicon sidewall 49 and the second silicon nitride film 48 are entirely removed except for the respective portions covered with the emitter and collector electrodes 45 and 46.

Next, the substrate is annealed, thereby diffusing arsenic atoms from the emitter electrode 45 into a region over the intrinsic base diffused layer 41b to form an emitter diffused layer 42 surrounded by the intrinsic base diffused layer 41b.

Figure 11:
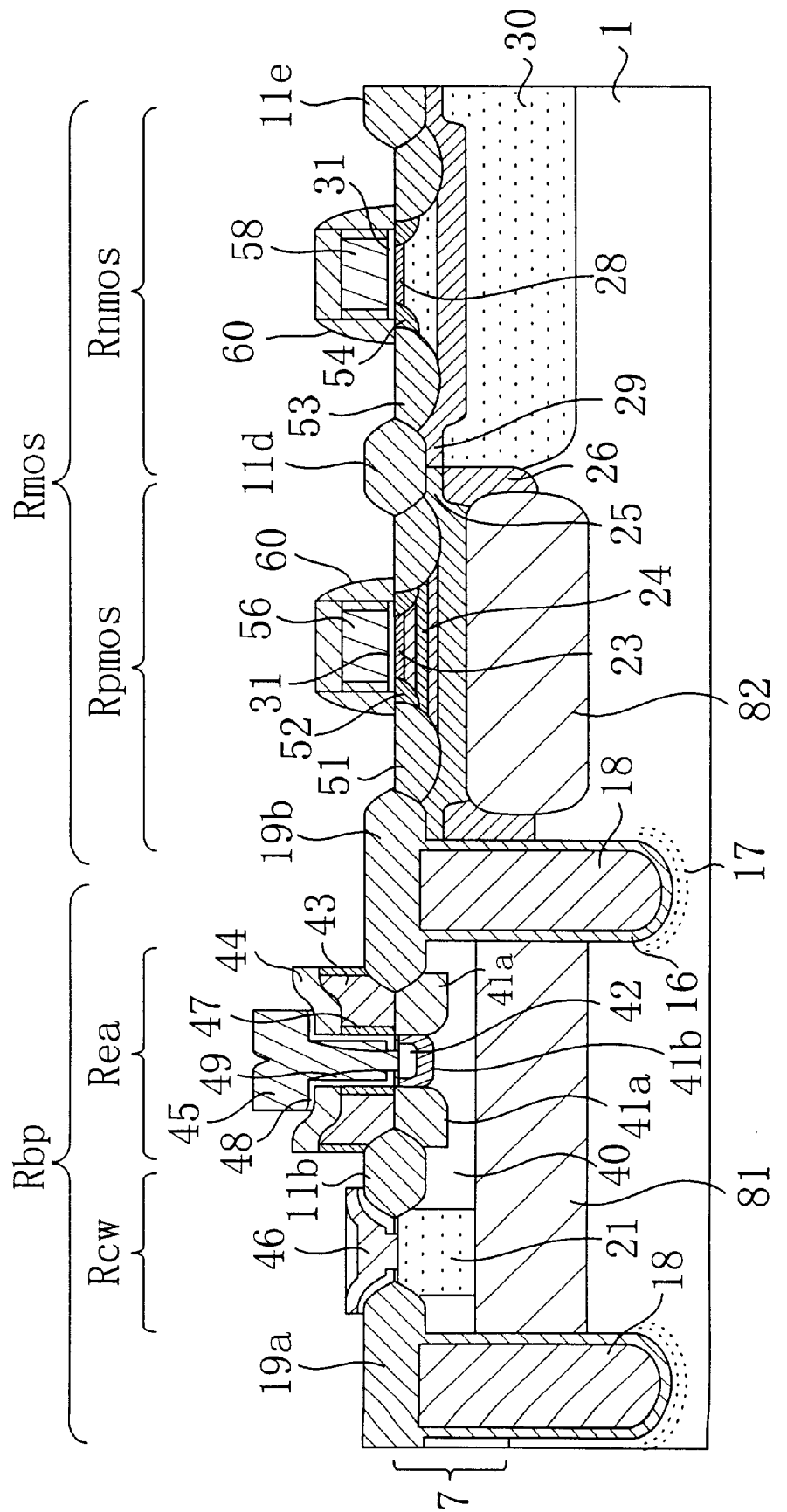
FIG. 11 is a cross-sectional view illustrating a state where the main portions of respective transistors have been formed according to the exemplary method of the present invention.

Then, ordinary process steps for forming an LDD-type MOS transistor are performed, thereby forming PMOSFET and NMOSFET in the MOS-transistor-forming region Rmos as shown in FIG. 11. The PMOSFET includes: p$^+$-type source/drain layers 51; p$^-$-type source/drain (LDD) layers 52; gate oxide film 31; gate electrode 56; and polysilicon sidewall 60. The NMOSFET includes: n$^+$-type source/drain layers 53; n-type source/drain (LDD) layers 54; gate oxide film 31; gate electrode 58; and polysilicon sidewall 60.

By performing these process steps, a Bi-CMOS device is completed.

According to the inventive method for fabricating a semiconductor device, the following effects are attained.

In the conventional fabrication process, the base electrode 43 of the bipolar transistor is often formed out of a silicon film deposited in the polycrystalline state (i.e., a polysilicon film). Thus, the thinner an oxide film in the interface between the polysilicon film and a semiconductor substrate, the more likely the oxide film grows abnormally. Since the interfacial oxide film cannot be thin in such a case, the contact resistance between the base electrode and the extrinsic base diffused layer is hard to reduce.

In contrast, according to the method of the present invention, the interfacial oxide film is completely removed by dip etching before the silicon film 33 in the amorphous state is grown in the process step shown in FIG. 5. And when the silicon film 33 is grown, the wafer is inserted into the furnace at a temperature as low as 400° C. Accordingly, the formation of a natural oxide film, which is formed on a substrate due to the exposure to the air, can be minimized. Even though almost no oxide film exists on the surface of the substrate, the silicon film 33 does not grow abnormally. This is because the silicon film for forming the base electrode 43 of the bipolar transistor and the gate electrodes 56 and 58 of the p- and n-channel MOS transistors is deposited in the amorphous state in the process step shown in FIG. 6. That is to say, since the interfacial oxide film between the silicon film 33 and the substrate can be much thinner, the contact resistance between the base electrode and the extrinsic base diffused layer 41a can be considerably reduced. As a result, the noise characteristic of the bipolar transistor at a higher frequency can be improved.

Figure 12:
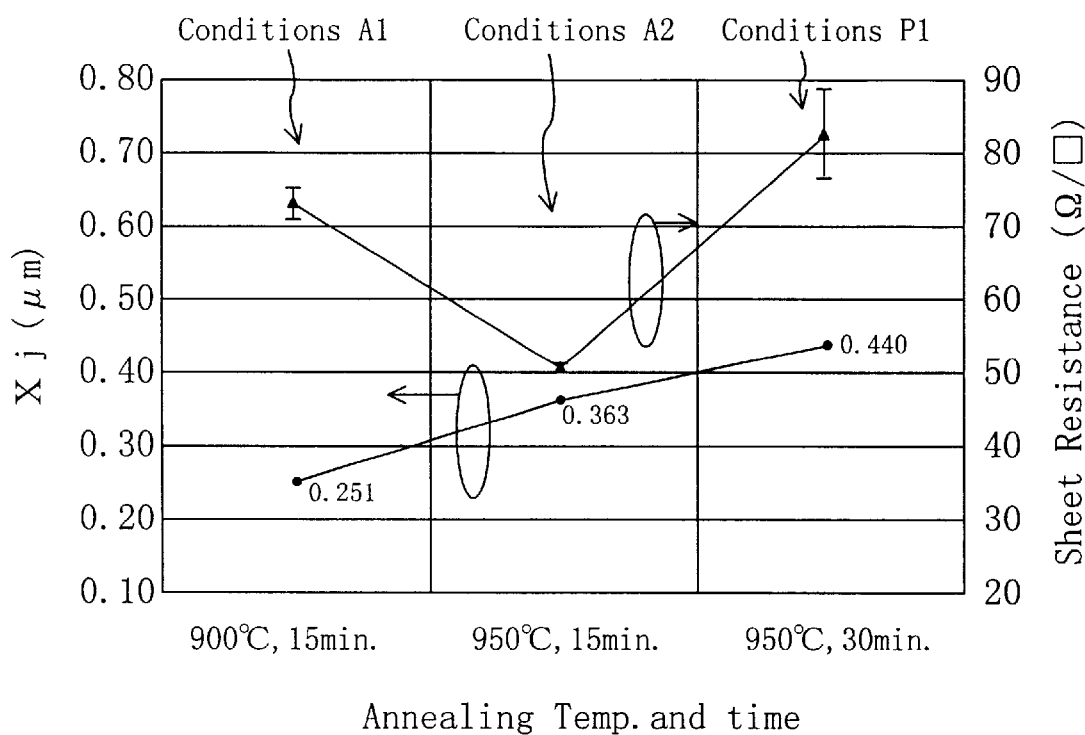
FIG. 12 is a chart illustrating in comparison the depths and sheet resistances of respective extrinsic base diffused layers formed by the annealing process according to the present invention and the conventional annealing process.

FIG. 12 is a chart illustrating in comparison the depths Xj and sheet resistances of respective extrinsic base diffused layers formed by inventive annealing under two sets of conditions and by conventional annealing. In FIG. 12, the conditions A1 define the annealing temperature and time at 900° C. and 15 minutes, respectively; the conditions A2 at 950° C. and 15 minutes, respectively; and the conventional conditions P1 at 950° C. and 30 minutes, respectively. As shown in FIG. 12, according to the conventional process, the resulting extrinsic base diffused layer is deeper and shows a higher sheet resistance. In contrast, according to the method of the present invention, the sheet resistance of the extrinsic base diffused layer 41 is lower than the conventional value under either conditions A1 or conditions A2. Under the conditions A1, the sheet resistance of the extrinsic base diffused layer 41a is not so lower than the conventional value. However, although the inventive annealing is conducted at a lower temperature of 900° C. for only a half period of time (i.e., 15 minutes), the resulting sheet resistance is still lower than that attained by the conventional annealing at 950° C. for 30 minutes.

Also, in the conventional process, annealing is conducted at an elevated temperature of 950° C. for 30 minutes, for example (under the conditions P1 shown in FIG. 12), to break down the oxide film and thereby reduce the contact resistance. In such a case, the depth Xj of the extrinsic base diffused layer 41a is as long as 0.44 μm as shown in FIG. 12, resulting in increase in base-collector capacitance. Consequently, the bipolar transistor cannot operate at a higher frequency or the emitter-base breakdown voltage BV$_{EBO}$ adversely decreases.

In contrast, according to the method of the present invention, there is no need to break down the oxide film by conducting annealing at an elevated temperature. For example, if annealing is conducted at 900° C. for 15 minutes (i.e., under the conditions A1 shown in FIG. 12), the depth Xj of the extrinsic base diffused layer 41a can be reduced to about 0.25 μm.

Figure 13:
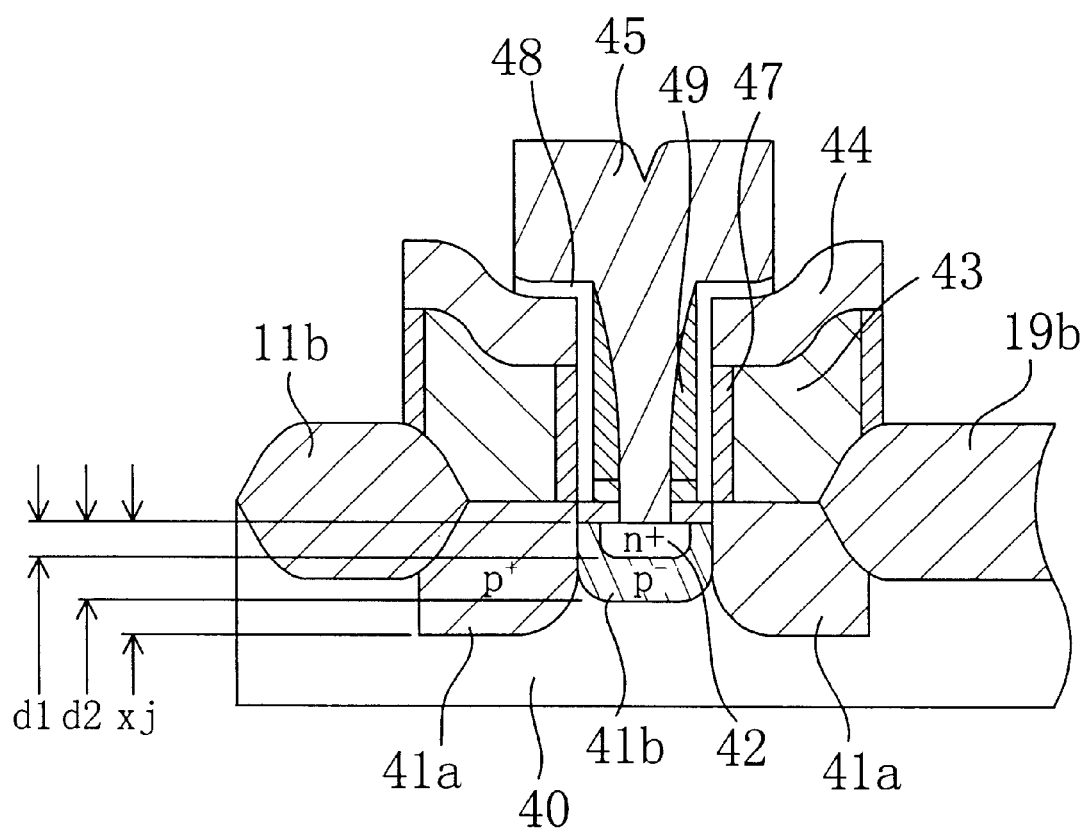
FIG. 13 is a cross-sectional view illustrating, on a larger scale, only a part of the bipolar transistor in the active region according to the exemplary embodiment of the present invention.
Figure 14A:
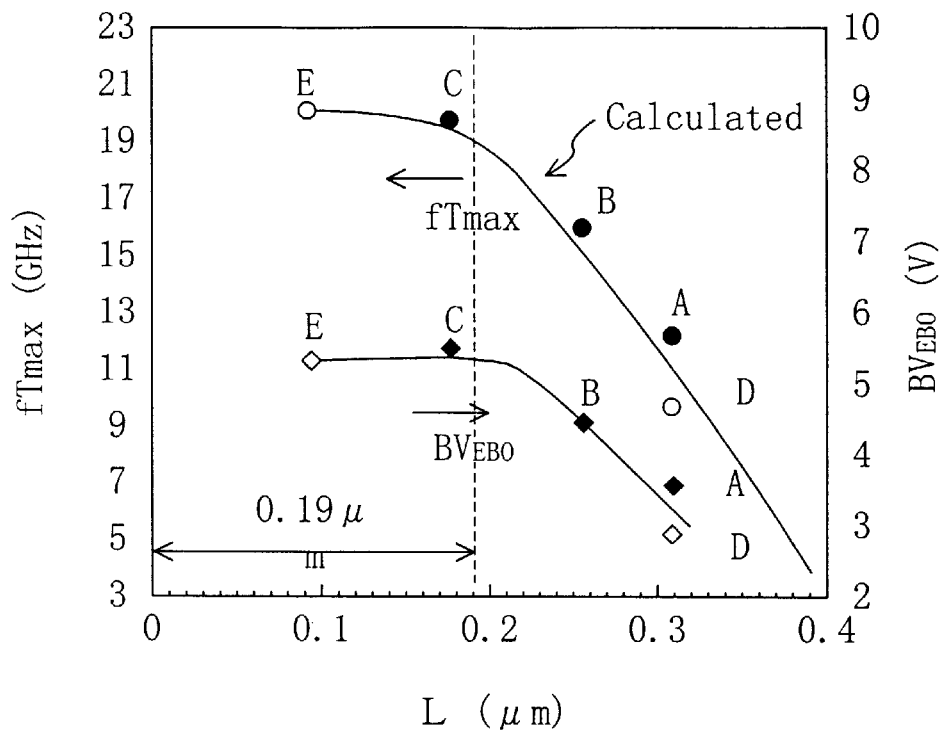
FIG. 14(a) is a graph illustrating relationships between the lateral diffusion length of an extrinsic base diffused layer and radio frequency characteristics.
Figure 14B:
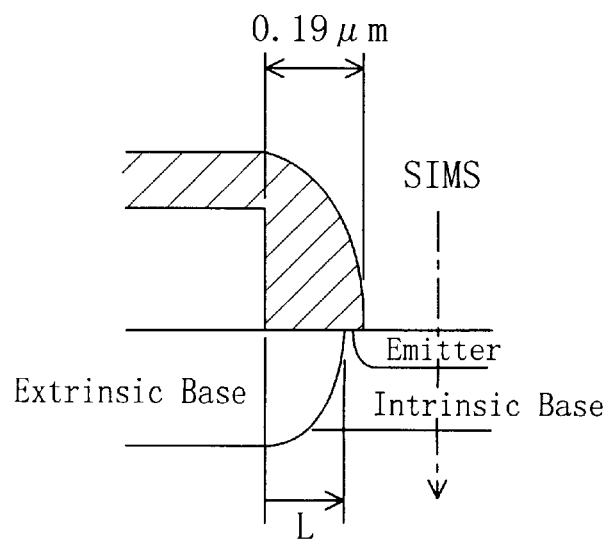
FIG. 14(b) is a cross-sectional view illustrating how the lateral diffusion length of the extrinsic base diffused layer is defined.
Figure 15:
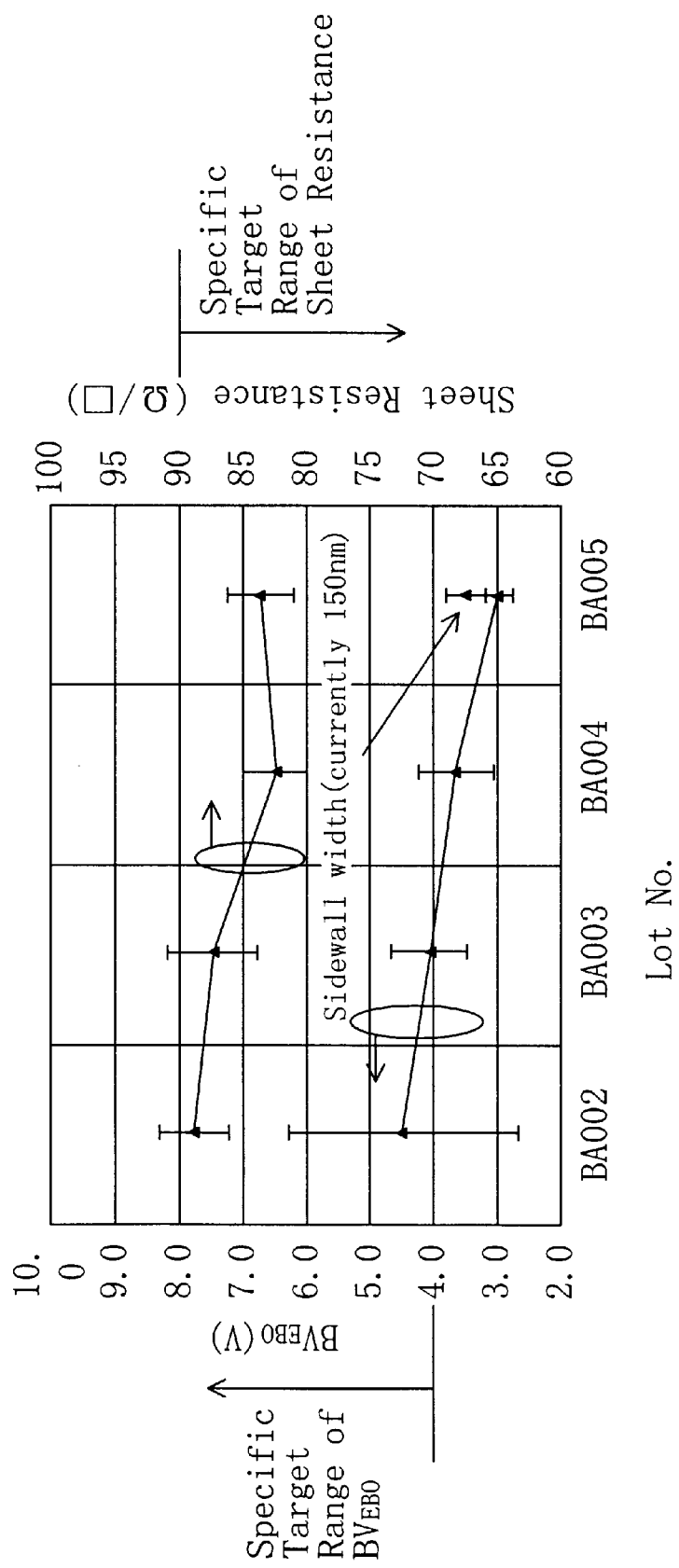
FIG. 15 is a chart illustrating variations in emitter-base breakdown voltage and sheet resistivity of an extrinsic base diffused layer according to a conventional process.
Figure 16:
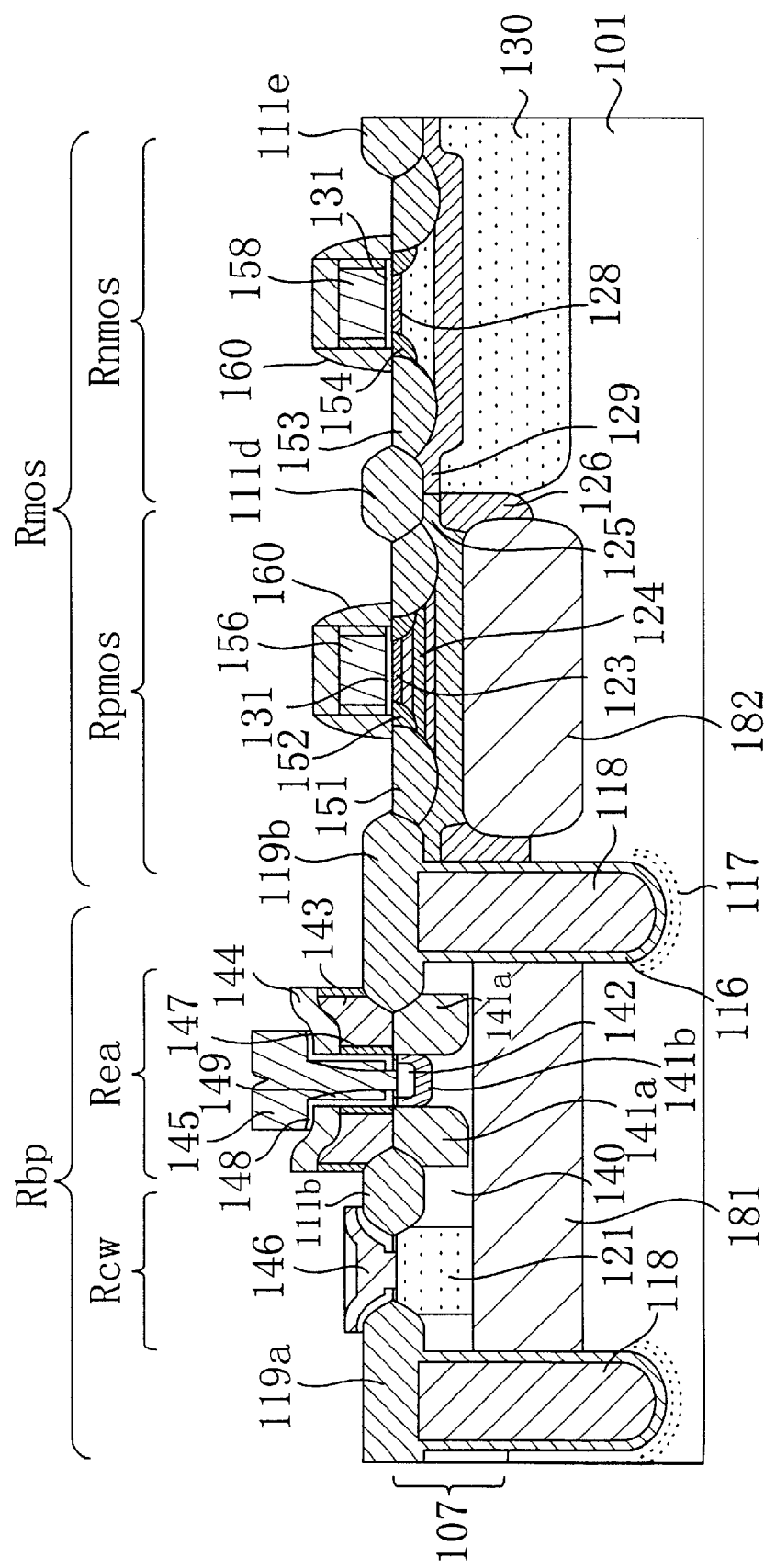
FIG. 16 is a cross-sectional view illustrating a structure of a conventional Bi-CMOS device.

FIG. 13 is a cross-sectional view illustrating, on a larger scale, only the active region of the bipolar transistor in the Bi-CMOS device formed by the method of the present invention, along with an exemplary size relationship among respective portions. As shown in FIG. 13, in the bipolar transistor formed by the method of the present invention, the depth d1 of the emitter diffused layer 42 may be 0.119 μm, and the depth d2 of the intrinsic base diffused layer 41b at the bottom thereof may be 0.236 μm. That is to say, the width (or thickness) of the intrinsic base diffused layer 41b may be 0.117 μm. The depth Xj of the extrinsic base diffused layer 41a may be 0.251 μm, which is much smaller than the depth of 0.44 μm in the conventional semiconductor device.

The following Table 1 summarizes the relationships between respective conditions and the resulting depths of the extrinsic base diffused layers.

TABLE 1

| Condition | Electrode Material | Dose of Boron | Drive-in | Extrinsic base depth |
|---|---|---|---|---|
| A | Poly-Si inserted at normal temp. | 7.0E + 15 | FA: 950° C., 30 min. + FA: 900° C., 30 min. | 0.44 μm |
| B | a-Si inserted at low temp. | 7.0E + 15 | FA: 950° C., 15 min. + FA: 900° C., 30 min. | 0.36 μm |
| C | a-Si inserted at low temp. | 7.0E + 15 | FA: 900° C., 15 min. + FA: 900° C., 30 min. | 0.25 μm |
| D | Poly-Si inserted at normal temp | 7.0E + 15 | FA: 950° C., 30 min. + RTA: 1050° C., 30 sec. | (0.44 μm) |

In addition, unlike the base electrode 43 made of polysilicon, the conditions for annealing, which is conducted to activate the dopant in the base electrode 43, are not affected by the sizes of grains in polysilicon, and the resistance can be reduced with much more certainty. Also, a variation in resistance can be reduced.

That is to say, by forming both the base electrode 43 of the bipolar transistor and the gate electrodes 56 and 58 of the p- and n-channel MOS transistors out of the same amorphous silicon film, a resistance can be kept as low as that of a polysilicon electrode and a variation in resistance can be reduced. In addition, the contact resistance between the silicon film (probably in almost single crystalline state) constituting the base electrode 43 of the bipolar transistor and the extrinsic base diffused layer 41a within the substrate can be reduced, and the extrinsic base diffused layer 41a can be shallower.

Furthermore, epitaxy is harder to advance in the interface between the substrate and the silicon film deposited in the amorphous state, compared to the silicon film deposited in the polycrystalline state. Accordingly, a variation in radio frequency characteristics due to partial epitaxy can be suppressed.

What is claimed is:

1. A method for fabricating a semiconductor device comprising a MIS transistor and a bipolar transistor, the bipolar transistor including: an emitter diffused layer of a second conductivity type; and a collector diffused layer of the first conductivity type, the method comprising the steps of:

(a) providing an isolating region on a semiconductor substrate to divide a region where the bipolar transistor is to be formed from a region where the MIS transistor is to be formed, and to divide a region of the semiconductor substrate, where the bipolar transistor is to be formed, into an active region and a collector-forming region;

(b) after the step (a), forming a gate insulating film on the semiconductor substrate;

(c) after the step (b), retaining the gate insulating film only in the entire region where the MIS transistor is formed by removing the gate insulating film on the region where the bipolar transistor is formed;

(d) after the step (c), forming an amorphous semiconductor film, containing a dopant of the second conductivity type, over the semiconductor substrate, whereby the gate insulating film is formed in the entire region where the MIS transistor is formed, and chemical oxide film is removed from the surfaces of the collector-forming region and active region;

(e) forming an upper insulating film over the entire surface of the semiconductor film;

(f) patterning the upper insulating film and the semiconductor film to form a base electrode of the semiconductor film over the active region, the base electrode having an opening for emitter electrode and an outer edge positioned in the isolating region, and at the same time forming the gate electrode made of the semiconductor film on the region where the MIS transistor is formed.

2. The method of claim 1, wherein the step after (c) and before (d), is performed such that the oxide film is completely removed by dip etching after the semiconductor substrate has been boiled within a mixed water of hydrogen peroxide and ammonia.

3. The method of claim 1, wherein in the step (d), temperature of 400° C. or less is applied onto the semiconductor substrate, and the semiconductor film is grown at a temperature between 500° C. and 550°C.

4. The method of claim 1, further comprising, after the step (f), (g) diffusing the dopant of the second conductivity type, which is contained in the base electrode, into the semiconductor substrate through annealing, thereby forming an extrinsic base diffused layer;

(h) implanting dopant ions of the second conductivity type through the opening for emitter electrode into the semiconductor substrate using the base electrode as a mask, thereby forming an intrinsic base diffused layer linked to the extrinsic based diffused layer;

(i) forming the emitter diffused layer by introducing a dopant of the first conductivity type into a region of the semiconductor substrate, which is located over the intrinsic base diffused layer, and forming an emitter electrode within the opening for emitter electrode so as to contact the emitter diffused layer; and (j) forming the collector diffused layer, containing the dopant of the first conductivity type, and a collector electrode, containing the collector diffused layer, in the collector-forming region.

5. The method of claim 4 wherein the step (g) is performed at a temperature of 900° C. or less.

6. The method of claim 4, further comprising the step of forming a sidewall on a side of the base electrode between the steps (h) and (i), wherein in the step (i), the emitter electrode, containing the dopant of the first conductivity type, is formed within a region surrounded by the sidewall, and then the dopant of the first conductivity type contained in the emitter electrode is diffused by annealing toward the region over the intrinsic base diffused layer, thereby forming the emitter diffused layer.

* * * * *